(12) United States Patent
Lv et al.

(10) Patent No.: US 10,955,488 B2
(45) Date of Patent: Mar. 23, 2021

(54) MODULAR POWER SUPPLY MONITORING BY ACCESSORY INTERFACE OF A TEST AND MEASUREMENT INSTRUMENT

(71) Applicant: Tektronix, Inc., Beaverton, OR (US)

(72) Inventors: Haiping Lv, Shanghai (CN); Hai Wen Yu, Shanghai (CN)

(73) Assignee: Tektronix, Inc., Beaverton, OR (US)

( * ) Notice: Subject to any disclaimer, the term of this patent is extended or adjusted under 35 U.S.C. 154(b) by 396 days.

(21) Appl. No.: 15/959,072

(22) Filed: Apr. 20, 2018

(65) Prior Publication Data

US 2018/0335480 A1    Nov. 22, 2018

Related U.S. Application Data

(60) Provisional application No. 62/507,714, filed on May 17, 2017.

(51) Int. Cl.
*G01R 31/40* (2020.01)
*G01R 35/00* (2006.01)
*G01R 31/28* (2006.01)

(52) U.S. Cl.
CPC ......... *G01R 31/40* (2013.01); *G01R 31/2839* (2013.01); *G01R 35/00* (2013.01); *G01R 31/2844* (2013.01)

(58) Field of Classification Search
CPC ............ G01R 31/40; G01R 31/2844; G01R 31/2839; G01R 13/00; G01R 13/02; G01R 15/00; G01R 15/12; G05F 1/575; G06F 1/26
See application file for complete search history.

(56) References Cited

U.S. PATENT DOCUMENTS 4,037,156 A * 7/1977 Goujon ............... G01R 31/40
324/764.01
4,438,498 A * 3/1984 Sekel ..................... G05F 1/575
323/283

* cited by examiner

*Primary Examiner* — Amy He
(74) *Attorney, Agent, or Firm* — Miller Nash Graham & Dunn; Andrew J. Harrington

(57) ABSTRACT

A modular power supply including a voltage regulator configured to output a voltage, a first output configured to connect to a device under test and output the voltage from the regulator, a microcontroller connected to the voltage regulator, and an interface configured to connect to a test and measurement instrument. The interface includes an input configured to receive power from the test and measurement instrument and a second output configured to output a signal characteristic of the first output.

15 Claims, 2 Drawing Sheets

MODULAR POWER SUPPLY MONITORING BY ACCESSORY INTERFACE OF A TEST AND MEASUREMENT INSTRUMENT

CROSS REFERENCE TO RELATED PATENT APPLICATIONS

This application claims benefit of U.S. Provisional Application No. 62/507,714, filed May 17, 2017, titled MODULAR POWER SUPPLY MONITORING BY UTILIZING ACCESSORY INTERFACES OF AN OSCILLOSCOPE, which is incorporated by reference herein in its entirety.

TECHNICAL FIELD

Embodiments of the disclosure are directed to a power supply and, in particular, to a modular power supply that utilizes an interface of a test and measurement instrument to receive power and to output signal characteristics of the modular power supply.

BACKGROUND

Power supplies are often utilized when testing a device under test (DUT) with a test and measurement instrument. For example, a power supply may provide a particular voltage to the device under test to monitor and/or record various signal from the DUT with the test and measurement instrument. There are often times when a user may need to monitor a signal characteristic of a power supply, such as a current and/or voltage supplied by the power supply to the DUT.

Some power supplies provide current monitoring and waveform display functions directly on the power supply. However, such internal monitoring of power supplies is limited. For example, the bandwidth of a power supply's measuring system is typically limited, which may prevent the power supply's measuring system from correctly measuring the fast transit time of current changes.

In some situations, an oscilloscope may be employed to measure an electrical output from a power supply to compensate for the limited nature of a power supply's measuring system or if the power supply does not include a measuring system. However, a power supply may not be synchronized with the oscilloscope. Accordingly, the waveforms of the signals output from the power supply may not accurately align with other waveforms measured by the oscilloscope. In some situations, a current probe may be employed to measure and display current from the power supply on an oscilloscope. However, such a test configuration is both complex and expensive.

Embodiments of the disclosure address these and other issues of the prior art.

DETAILED DESCRIPTION

The present disclosure discusses a modular power supply that can be plugged into an accessory interface of a test and measurement instrument's input receptacles. The test and measurement instrument may be, for example, an oscilloscope. The modular power supply may receive power and commands from the test and measurement instrument through the accessory interface. The modular power supply may then provide pre-configured and/or programmed voltage/current to a device under test (DUT). The modular power supply may also include built-in current sensing circuits that connect through a secondary output to an input of the test and measurement instrument. The test and measurement instrument can recognize the modular power supply and configure the input channel to measure and display a signal characteristic, such as a current or a voltage, of the modular power supply in real time.

Figure 1:
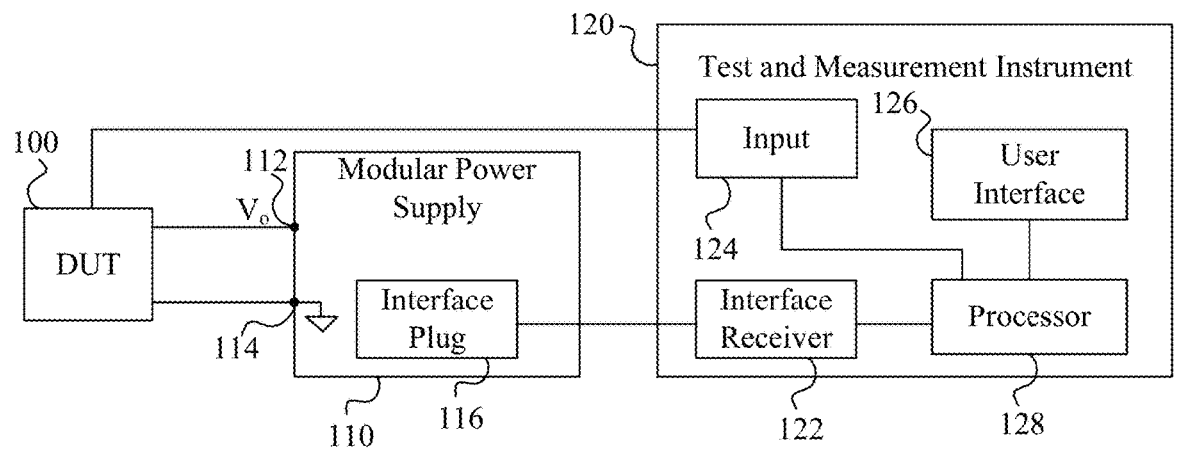
FIG. 1 is a block diagram of a test and measurement system according to some embodiments of the disclosure.

FIG. 1 is a block diagram illustrating a test and measurement system according to some embodiments of the disclosure. The test and measurement instrument system provides power to a DUT 100 through a modular power supply 110 connected to a test and measurement instrument 120, such as a MDO3000 Series Oscilloscope manufactured by Tektronix, Inc. The modular power supply 110, as will be discussed in more detail below with respect to FIG. 2, outputs a voltage Vo at a first output 112 to the DUT 100 and also provides a ground connection 114 to the DUT 100.

The modular power supply 110 also includes an interface 116 to directly connect to a receiver 122 of the test and measurement instrument 120. For example, the interface 116 may be a Versatile Probe Interface (VPI) plug that electrically connects to a VPI receiver of the test and measurement instrument 120. However, as will be understood by one of ordinary skill in the art, the interface 116 and the receiver 120 are not limited to a VPI interface and receiver, respectively, but may be any suitable type of interface and receiver having the features discussed below, such as another interface typically used to connect a probe to the test and measurement instrument 120. Through the interface 116 and the receiver 122, the test and measurement instrument 120 is able to automatically identify the modular power supply 110 and configure the input channel of the receiver 122 to measure a signal characteristic of the modular power supply 110.

The receiver 122 of the test and measurement instrument 120 includes an input port to the oscilloscope for receiving an input signal from the modular power supply, but also includes signal lines for providing power to the modular power supply 110, as well as signal lines for data and command communication between the modular power supply 110 and the test and measurement instrument 120. That is, the modular power supply 110 receives its power directly from the test and measurement instrument receiver 122.

The test and measurement instrument 120 may include, for example, one or more further inputs 124 to receive a signal from the DUT 100, as well as a user interface 126, which may include a display (not shown), and a processor 128. A user can program the modular power supply 110 through the user interface 126 to instruct the modular power supply 110 to output particular voltages to the DUT 100. The user may select, for example, the modular power supply 110 to output a first voltage, such as 3V, during a start-up of the DUT 100. After a predetermined amount of time, or a particular detected signal characteristic of the DUT 100 by the test and measurement instrument 120, the user may select the modular power supply 110 to output a second voltage, such as 2V, for the remainder of the test. That is, the user can change the output of the modular power supply 110 through the test and measurement instrument 120 user interface 126.

The actual voltage Vo output at the first output 112, as well as an electrical current at the first output 112, may be sent to the test and measurement instrument 120 through the interface 116 to receiver 122 for display on the user interface 126. The receiver 122 sends the received signals from the modular power supply 110 to the processor 128 for processing, which then sends the processed signals to the user interface 126 for display. Signals from the DUT 100 may be received through other input ports 124 for monitoring as well, as would be understood by one skilled in the art, and displayed on the user interface 126.

Accordingly, the test and measurement system of FIG. 1 allows an electric current, voltage, and/or other electrical characteristics of the modular power supply 110 to be controlled by the test and measurement instrument 120 and displayed on a user interface 126 of the test and measurement instrument.

Figure 2:
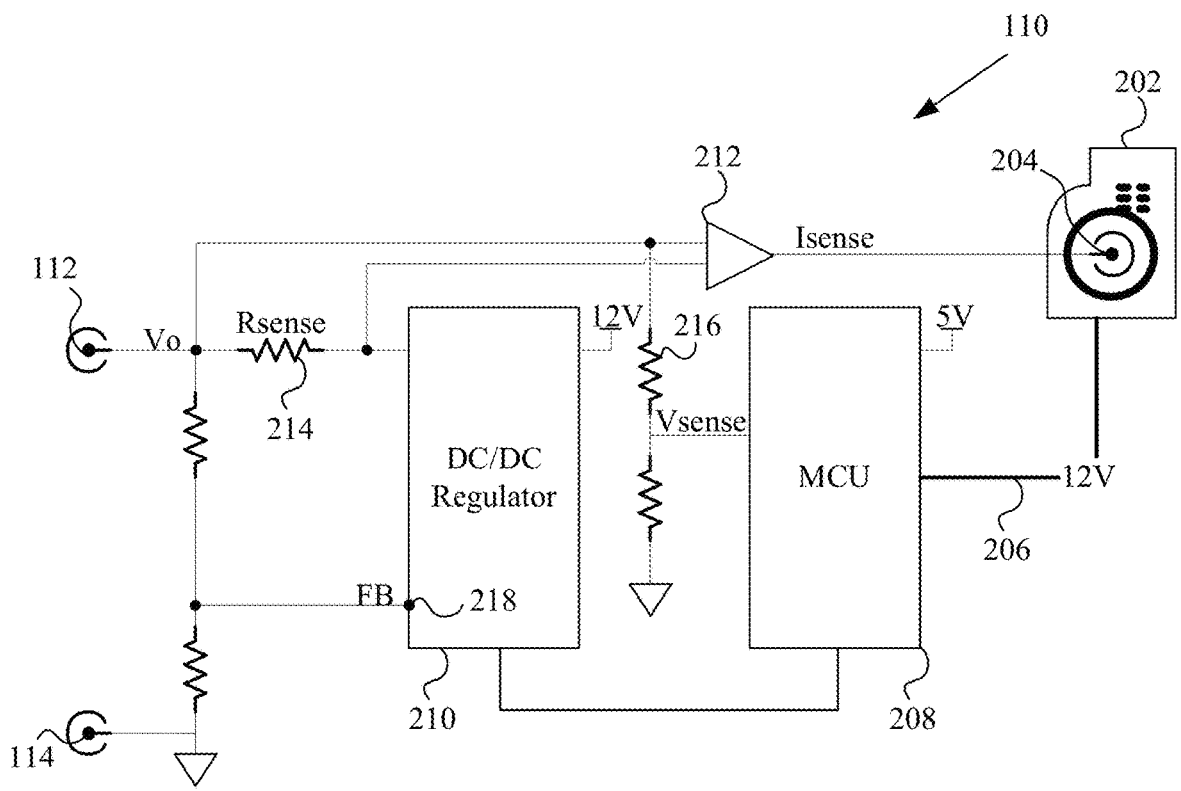
FIG. 2 is a block diagram of the modular power supply adapted for monitoring by a test and measurement system of FIG. 1 according to some embodiments of the disclosure.

FIG. 2 is a block diagram of an example modular power supply 110 of FIG. 1 according to some embodiments of the disclosure. The modular power supply 110 may include a VPI plug interface 202 to connect to the test and measurement instrument 120. However, as stated above, embodiments of the disclosure are not limited to such an interface. The interface 202 includes an output 204 to output a signal from the modular power supply 110 to the test and measurement instrument 120. The interface 202 also includes an input 206 to receive power from the test and measurement instrument. The input 206 may also send and receive data and command signals from the test and measurement instrument 120, or additional inputs may be included in the modular power supply 110 to send and receive the data and command signals to/from the test and measurement instrument 120, or to receive additional power from the test and measurement instrument 120.

The modular power supply 110 also includes a microcontroller unit (MCU) 208 and a voltage regulator 210, which may be, for example, a direct current (DC)-to-DC voltage regulator. The MCU 208 may be any form of processor/controller, such as an application specific integrated circuit, a digital signal processor, field programmable gate array, or microprocessor. The MCU 208 receives commands from the test and measurement instrument 120 indicating a voltage and/or current to be output by the modular power supply 110 at the first output 112.

The MCU 208 may send a signal to the voltage regulator 210 indicating a voltage to output at the first output 112 which connects to the DUT 100. An amplifier 212 is connected to the first output 112 as well as directly connected to an output from the voltage regulator 210, which is separated from the output by a resistor 214 (Rsense). This allows the amplifier 212 to measure the current across resistor 214. The amplifier 212 may increase the gain of the measured current for transmission to the test and measurement instrument 120. The current, Isense, is sent from the output of the amplifier 212 to the test and measurement instrument 120 through the output 204.

The MCU 208 may output to the test and measurement instrument 120 through the interface 202 a sensed voltage, Vsense. The MCU 208 connects to the first output 112 through a resistor 216, to determine the voltage that is output by the voltage regulator 210. Further, the voltage regulator 210 may also include an input 218 to receive the voltage at the first output 112 as a feedback loop to determine the accuracy of the voltage being output the voltage regulator 210. The voltage regulator 210 may adjust any output voltage based on the feedback, for example, if the voltage at the input 218 is more or less than expected.

Figure 3:
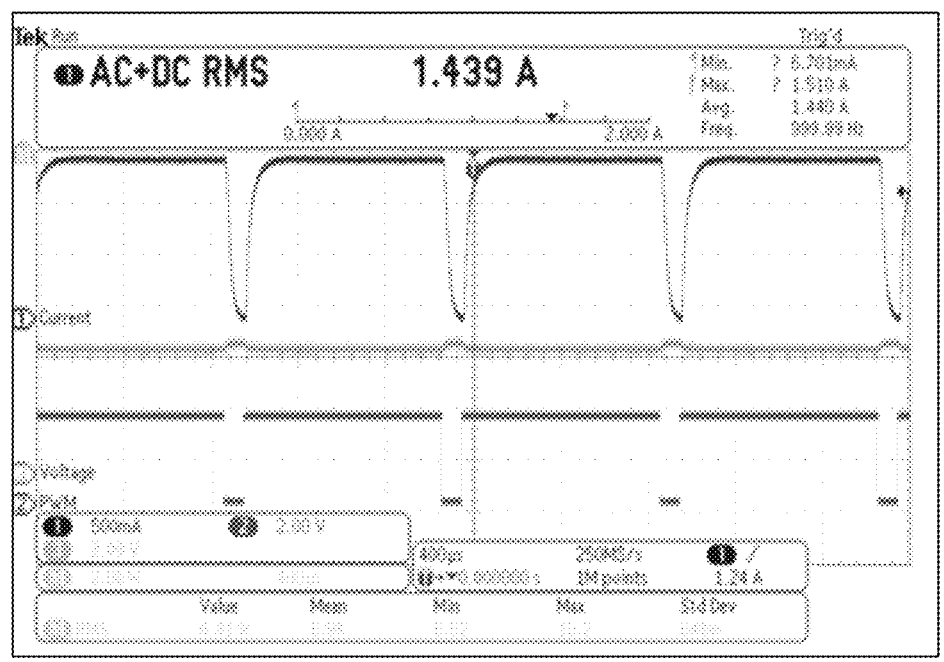
FIG. 3 is a graph of example waveforms produced by a modular power supply as displayed on the test and measurement instrument of FIG. 1.

FIG. 3 illustrates a display of the user interface 126 of the test and measurement instrument 120. The test and measurement instrument 120 receives through the receiver 122 an electrical current at the voltage output 112 of the modular power supply 110, which can be displayed in real time on the display of the user interface 126. As seen in FIG. 3, the actual voltage at the voltage output 112 of the modular power supply 110 is also received on the receiver 122 and displayed in real time on the display of the user interface 126. This allows the user to analyze in real time the actual outputs of the modular power supply 110 directly on the output of the test and measurement instrument 120.

The test and measurement instrument 120 may display any waveforms produced by the modular power supply 110. As shown in FIG. 3, the test and measurement instrument 120 can display current and voltage supplied by the modular power supply 110 in real time. Although not shown, the display may also include waveforms produced by the DUT in response to the received voltage and current from the modular power supply 110. The waveforms from the DUT can be synchronized with the output of the modular power supply 110.

The aspects of the present disclosure are susceptible to various modifications and alternative forms. Specific aspects have been shown by way of example in the drawings and are described in detail herein below. However, it should be noted that the examples disclosed herein are presented for the purposes of clarity of discussion and are not intended to limit the scope of the general concepts disclosed to the specific aspects described herein unless expressly limited. As such, the present disclosure is intended to cover all modifications, equivalents, and alternatives of the described aspects in light of the attached drawings and claims.

References in the specification to aspect, example, etc., indicate that the described item may include a particular feature, structure, or characteristic. However, every disclosed aspect may or may not necessarily include that particular feature, structure, or characteristic. Moreover, such phrases are not necessarily referring to the same aspect unless specifically noted. Further, when a particular feature, structure, or characteristic is described in connection with a particular aspect, such feature, structure, or characteristic can be employed in connection with another disclosed aspect whether or not such feature is explicitly described in conjunction with such other disclosed aspect.

Aspects of the disclosure may operate on a particularly created hardware, on firmware, digital signal processors, or on a specially programmed general purpose computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or non-transitory computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the technologies disclosed herein are provided below. An embodiment of the technologies may include any one or more, and any combination of, the examples described below.

Example 1 is a modular power supply, comprising a voltage regulator configured to output a pre-set voltage; a first output configured to connect to a device under test and output the pre-set voltage from the regulator; a microcontroller connected to the voltage regulator; and an interface configured to connect to a test and measurement instrument. The interface may include an input configured to receive electrical power from the test and measurement instrument, and a second output configured to output a signal characteristic of the first output.

Example 2 is the modular power supply of example 1, wherein the voltage regulator and the microcontroller receive the electrical power from the input of the interface.

Example 3 is the modular power supply of either one of examples 1 and 2, wherein the signal characteristic is an electric current.

Example 4 is the modular power supply of example 3, wherein the interface further includes a third output configured to output a voltage at the first output.

Example 5 is the modular power supply of any one of examples 1-4, wherein the signal characteristic is a voltage.

Example 6 is the modular power supply of any one of examples 1-5, wherein the microcontroller outputs a command to the voltage regulator to output the voltage at a predetermined level.

Example 7 is the modular power supply of example 6, wherein the input is a first input, further comprising a second input to receive the command from the test and measurement instrument.

Example 8 is the modular power supply of example 7, wherein the command from the test and measurement instrument includes outputting the voltage at the predetermined level for a first time period and then outputting the voltage at a second predetermined level.

Example 9 is a method for a modular power supply, the method including receiving electrical power from a test and measurement instrument at a microcontroller and a voltage regulator of the modular power supply; generating a signal from the microcontroller to the voltage regulator indicating the first voltage to output; outputting, at a first output connected to a device under test a voltage from the voltage regulator based on the signal from the microcontroller indicating a first voltage; and outputting at a second output connected to the test and measurement instrument, a signal characteristic of the first output.

Example 10 is the method of example 9, further comprising outputting through the microcontroller to the test and measurement instrument the voltage at the first output.

Example 11 is the method of either one of example 9 and 10, further comprising receiving a signal at the microcontroller from the test and measurement instrument to output a first voltage at the voltage regulator and the signal from the microcontroller to the voltage regulator is based on the signal from the test and measurement instrument.

Example 12 is the method of example 11, wherein the received signal may include a command to output the first voltage for a predetermined amount of time and then output a second voltage, different from the first voltage, when the predetermined amount of time has elapsed.

Example 13 is the method of any one of examples 9-12, wherein the signal characteristic is an electric current.

Example 14 is the method of any one of examples 9-13, wherein the signal characteristic is a voltage.

Example 15 is one or more computer readable storage media having instructions stored thereon that, when executed by a microcontroller of a modular power supply, cause the modular power supply to generate a signal from the microcontroller to a voltage regulator indicating a first voltage to output by the voltage regulator; output at a first output connected to a device under test a voltage from the voltage regulator based on the signal from the microcontroller indicating the first voltage; and output at a second output directly connected to an interface of a test and measurement instrument a signal characteristic of the first output.

Example 16 is the one or more computer readable storage media of example 15, further including instructions that cause the modular power supply to output through the microcontroller to the test and measurement a voltage at the first output.

Example 17 is the one or more computer readable storage media of either one of examples 15 and 16, further including instructions that cause the modular power supply to receive a signal at the microcontroller from the test and measurement instrument to output a first voltage at the voltage regulator and the signal from the microcontroller to the voltage regulator is based on the signal from the test and measurement instrument.

Example 18 is the one or more computer readable storage media of example 17, wherein the received signal may include a command to output the first voltage for a predetermined amount of time and then output a second voltage, different from the first voltage, when the predetermined amount of time has elapsed.

Example 19 is the one or more computer readable storage media of any one of examples 15-18, wherein the signal characteristic is an electrical current.

Example 20 is the one or more computer readable storage media of any one of examples 15-19, wherein the signal characteristic is a voltage.

The previously described versions of the disclosed subject matter have many advantages that were either described or would be apparent to a person of ordinary skill. Even so, these advantages or features are not required in all versions of the disclosed apparatus, systems, or methods.

Additionally, this written description makes reference to particular features. It is to be understood that the disclosure in this specification includes all possible combinations of those particular features. For example, where a particular feature is disclosed in the context of a particular aspect, that feature can also be used, to the extent possible, in the context of other aspects.

Also, when reference is made in this application to a method having two or more defined steps or operations, the defined steps or operations can be carried out in any order or simultaneously, unless the context excludes those possibilities.

Although specific aspects of the disclosure have been illustrated and described for purposes of illustration, it will be understood that various modifications may be made without departing from the spirit and scope of the disclosure. Accordingly, the disclosure should not be limited except as by the appended claims.

What is claimed is:

1. A modular power supply, comprising:
   a voltage regulator configured to output a pre-set voltage;
   a first output configured to connect to a device under test and output the pre-set voltage from the voltage regulator;
   a microcontroller connected to the voltage regulator;
   a current measuring circuit configured to measure an electric current at the first output; and
   an interface configured to connect to a test and measurement instrument, the interface including:
      an input configured to receive electrical power from the test and measurement instrument, and
      a second output configured to output the electric current at the first output.

2. The modular power supply of claim 1, wherein the voltage regulator and the microcontroller receive the electrical power from the input of the interface.

3. The modular power supply of claim 1, wherein the interface further includes a third output configured to output a voltage at the first output.

4. The modular power supply of claim 1, wherein the microcontroller outputs a command to the voltage regulator to output the voltage at a predetermined level.

5. The modular power supply of claim 4, wherein the input is a first input, further comprising a second input to receive the command from the test and measurement instrument.

6. The modular power supply of claim 5, wherein the command from the test and measurement instrument includes outputting the voltage at the predetermined level for a first time period and then outputting the voltage at a second predetermined level.

7. A method for a modular power supply, the method including:
   receiving electrical power from a test and measurement instrument at a microcontroller and a voltage regulator of the modular power supply;
   generating a signal from the microcontroller to the voltage regulator indicating a first voltage to output;
   outputting, at a first output connected to a device under test, a voltage from the voltage regulator based on the signal from the microcontroller indicating the first voltage; and
   outputting, at a second output connected to the test and measurement instrument, a an electric current at the first output.

8. The method of claim 7, further comprising outputting through the microcontroller to the test and measurement instrument the voltage at the first output.

9. The method of claim 7, further comprising receiving a signal at the microcontroller from the test and measurement instrument to output a first voltage at the voltage regulator and the signal from the microcontroller to the voltage regulator is based on the signal from the test and measurement instrument.

10. The method of claim 9, wherein the received signal may include a command to output the first voltage for a predetermined amount of time and then output a second voltage, different from the first voltage, when the predetermined amount of time has elapsed.

11. The method of claim 7, further comprising outputting to the test and measurement instrument a voltage at the first output.

12. One or more computer readable storage media having instructions stored thereon that, when executed by a microcontroller of a modular power supply, cause the modular power supply to:
   generate a signal from the microcontroller to a voltage regulator indicating a first voltage to output by the voltage regulator;
   output at a first output connected to a device under test a voltage from the voltage regulator based on the signal from the microcontroller indicating the first voltage; and
   output at a second output directly connected to an interface of a test and measurement instrument an electric current at the first output.

13. The one or more computer readable storage media of claim 12, further including instructions that cause the modular power supply to output through the microcontroller to the test and measurement instrument a voltage at the first output.

14. The one or more computer readable storage media of claim 12, further including instructions that cause the modular power supply to receive a signal at the microcontroller from the test and measurement instrument to output a first voltage at the voltage regulator and the signal from the microcontroller to the voltage regulator is based on the signal from the test and measurement instrument.

15. The one or more computer readable storage media of claim 14, wherein the received signal may include a command to output the first voltage for a predetermined amount of time and then output a second voltage, different from the first voltage, when the predetermined amount of time has elapsed.

* * * * *